(12) United States Patent
Voogd et al.

(10) Patent No.: US 9,116,446 B2
(45) Date of Patent: Aug. 25, 2015

(54) LITHOGRAPHIC APPARATUS AND METHOD

(75) Inventors: Robbert Jan Voogd, Neerpelt (BE); Haico Victor Kok, Veldhoven (NL); Bearrach Moest, Eindhoven (NL); Petrus Franciscus Van Gils, Ryen (NL)

(73) Assignee: ASML Netherlands B.V., Veldhoven (NL)

( * ) Notice: Subject to any disclaimer, the term of this patent is extended or adjusted under 35 U.S.C. 154(b) by 872 days.

(21) Appl. No.: 13/243,528

(22) Filed: Sep. 23, 2011

(65) Prior Publication Data
US 2012/0242967 A1    Sep. 27, 2012

Related U.S. Application Data

(60) Provisional application No. 61/408,836, filed on Nov. 1, 2010.

(51) Int. Cl.
*G03F 9/00* (2006.01)
*G03F 7/20* (2006.01)

(52) U.S. Cl.
CPC .......... *G03F 9/7069* (2013.01); *G03F 7/70066* (2013.01); *G03F 7/7085* (2013.01)

(58) Field of Classification Search
CPC . G03F 9/7069; G03F 7/7066; G03F 7/70075; G03F 7/70083; G03F 7/7015; G03F 7/70158; G03F 7/70191; G03F 7/70558; G03F 7/7085
USPC ........... 355/52, 53, 55, 67–71, 75–77; 250/492.1, 492.2, 492.22, 548; 430/5, 430/8, 22, 30, 311, 321
See application file for complete search history.

(56) References Cited

U.S. PATENT DOCUMENTS

| | | | |
|---|---|---|---|
| 5,473,410 A * | 12/1995 | Nishi | 355/53 |
| 5,486,896 A * | 1/1996 | Hazama et al. | 355/71 |
| 6,259,509 B1 * | 7/2001 | Miwa et al. | 355/53 |
| 6,366,341 B1 * | 4/2002 | Shirato et al. | 355/69 |
| 6,541,750 B1 * | 4/2003 | Smith | 250/208.1 |
| 6,982,786 B2 | 1/2006 | Shiode | |
| 7,075,651 B2 * | 7/2006 | Tsukakoshi | 356/399 |
| 7,148,948 B2 | 12/2006 | Sano | |

(Continued)

FOREIGN PATENT DOCUMENTS

| | | |
|---|---|---|
| JP | 2000-223406 A | 8/2000 |
| JP | 2001-196287 A | 7/2001 |

(Continued)

OTHER PUBLICATIONS

English translation of JP2001-196287, published on Jul. 19, 2001.*

*Primary Examiner* — Christina Riddle
(74) *Attorney, Agent, or Firm* — Sterne, Kessler, Goldstein & Fox P.L.L.C

(57) ABSTRACT

A lithographic apparatus comprising an illumination system for providing a beam of radiation, a support structure for supporting a patterning device, the patterning device serving to impart the radiation beam with a pattern in its cross-section, a substrate table for holding a substrate, and a projection system for projecting the patterned radiation beam onto a target portion of the substrate, wherein the lithographic apparatus further comprises a patterning device masking blade provided with a hole, a diffusing material being located at the hole.

18 Claims, 4 Drawing Sheets

(56) References Cited

U.S. PATENT DOCUMENTS

| | | | |
|---|---|---|---|
| 2001/0043321 A1* | 11/2001 | Nishi et al. | 355/67 |
| 2001/0055733 A1* | 12/2001 | Irie et al. | 430/396 |
| 2004/0114121 A1* | 6/2004 | Nishi et al. | 355/67 |
| 2007/0081138 A1 | 4/2007 | Kerkhof et al. | |
| 2007/0091290 A1 | 4/2007 | Van De Kerkhof et al. | |
| 2012/0075610 A1* | 3/2012 | Dierichs et al. | 355/67 |

FOREIGN PATENT DOCUMENTS

| | | |
|---|---|---|
| JP | 2005-158829 A | 6/2005 |
| JP | 2006-108465 A | 4/2006 |
| JP | 2007-110116 A | 4/2007 |
| JP | 2007-194537 A | 8/2007 |
| JP | 2008-078478 A | 4/2008 |
| WO | WO 03/088329 A1 | 10/2003 |
| WO | WO 2005/106593 A2 | 11/2005 |

* cited by examiner

LITHOGRAPHIC APPARATUS AND METHOD

CROSS REFERENCE TO RELATED APPLICATIONS

This application claims benefit under 35 U.S.C. 119(e) to U.S. Provisional Application No. 61/408,836, filed Nov. 1, 2010, which is incorporated by reference herein in its entirety.

BACKGROUND OF THE INVENTION

1. Field of the Invention

The present invention relates to a lithographic apparatus and method.

2. Background Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

It is desirable to monitor properties of a radiation beam that is used by the lithographic apparatus to project the pattern from the mask or reticle onto the substrate (e.g., to determine properties of projection system that is used to project the pattern). It is also desirable to be able to monitor alignment of the mask or reticle and the substrate (or a substrate table). Sensors that are used to measure radiation beam properties and to monitor alignment may require the radiation beam to be diffuse in order to allow detection of beam properties or to allow monitoring of alignment with a desired accuracy.

It is desirable to provide, for example, a lithographic apparatus in which diffuse radiation may be generated in a manner that differs from the prior art.

SUMMARY OF THE INVENTION

According to a first aspect of the invention there is provided a lithographic apparatus comprising an illumination system for providing a beam of radiation, a support structure for supporting a patterning device, the patterning device serving to impart the radiation beam with a pattern in its cross-section, a substrate table for holding a substrate, and a projection system for projecting the patterned radiation beam onto a target portion of the substrate, wherein the lithographic apparatus further comprises a patterning device masking blade provided with a hole, a diffusing material being located at the hole.

According to a second aspect of the invention there is provided a patterning device masking blade provided with at least one hole, a diffusing material being located at the hole.

According to a third aspect of the invention there is provided a method of performing a measurement in a lithographic apparatus, the method comprising moving a patterning device masking blade from a first position in which the masking blade applies an edge to a radiation beam used to project a pattern from a patterning means onto a substrate, to a second position in which the masking blade blocks the majority of the radiation beam but allows a portion of the radiation beam to pass through a hole provided with a diffusing material, then detecting the radiation using a sensor located beyond a projection system of the lithographic apparatus.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
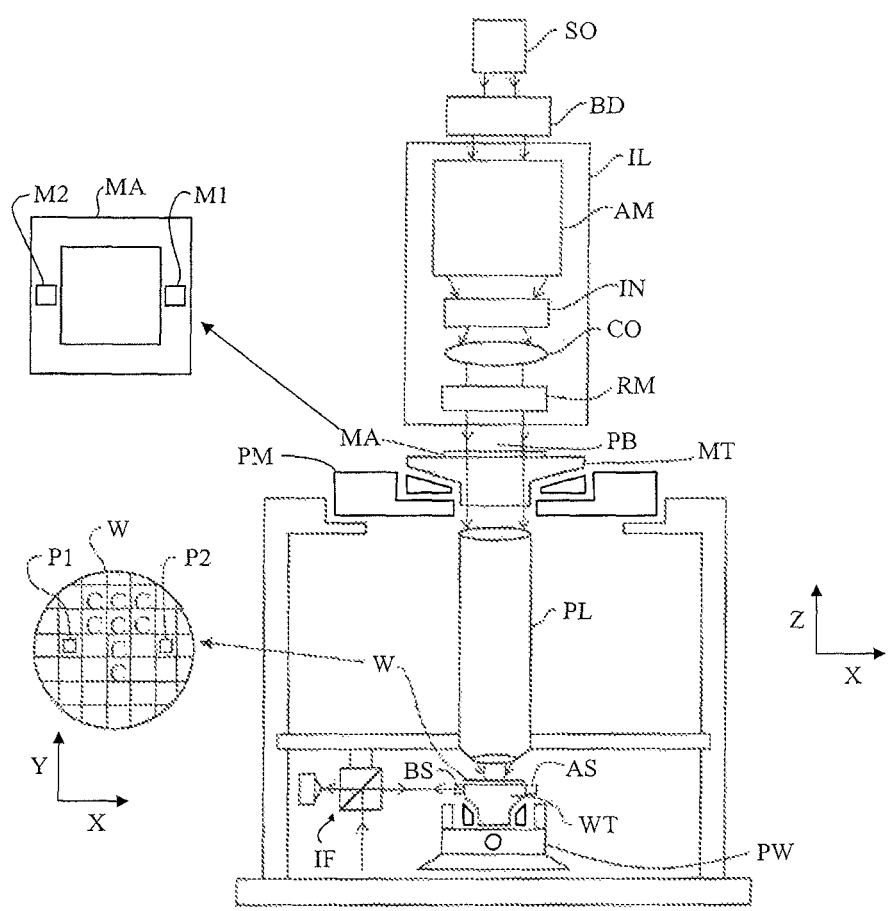
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of that can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and that may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens."

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g., UV radiation or EUV radiation).

a support structure (e.g., a support structure) MT to support a patterning device (e.g., a mask) MA and connected to first positioning device PM to accurately position the patterning device with respect to item PL;

a substrate table (e.g., a wafer table) WT for holding a substrate (e.g., a resist coated wafer) W and connected to second positioning device PW for accurately positioning the substrate with respect to item PL; and a projection system (e.g., a refractive projection lens) PL configured to image a pattern imparted to the radiation beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator includes a patterning device masking apparatus RM that is provided with masking blades that may be used to adjust edges of the radiation beam (as described further below). The illuminator provides a conditioned beam of radiation PB, having a desired uniformity and intensity distribution in its cross section. Properties of the radiation beam (e.g., aberrations) may be measured using a sensor BS located at the substrate table WT.

The radiation beam PB is incident on the patterning device (e.g., mask) MA, which is held on the support structure MT. Having traversed the patterning device MA, the beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2. Patterning device MA may be aligned to the substrate table WT using the patterning device alignment marks M1, M2 and an alignment sensor AS provided on the substrate table.

The depicted apparatus can be used in the following preferred modes:

1. In step mode, the support structure MT and the substrate table WT are kept essentially stationary, while an entire pattern imparted to the beam PB is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e., a single dynamic exposure). The velocity and direction of the substrate table WT relative to the support structure MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
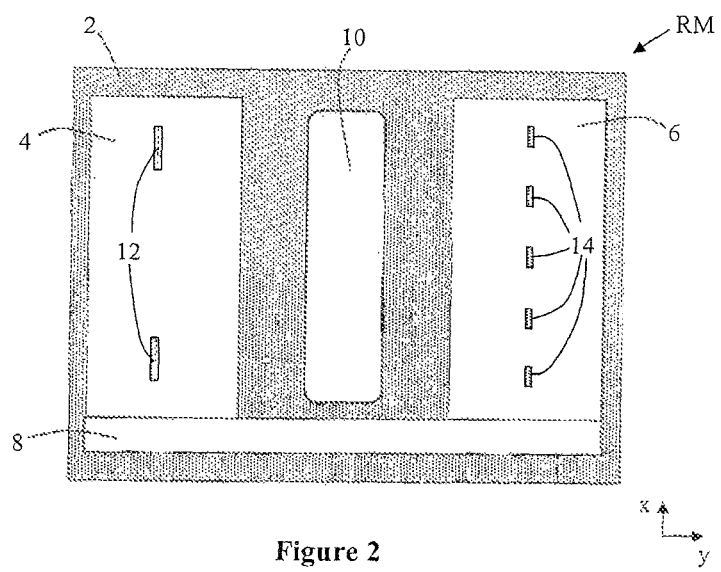
FIG. 2 depicts a patterning device masking apparatus according to an embodiment of the invention in a first configuration.
Figure 3:
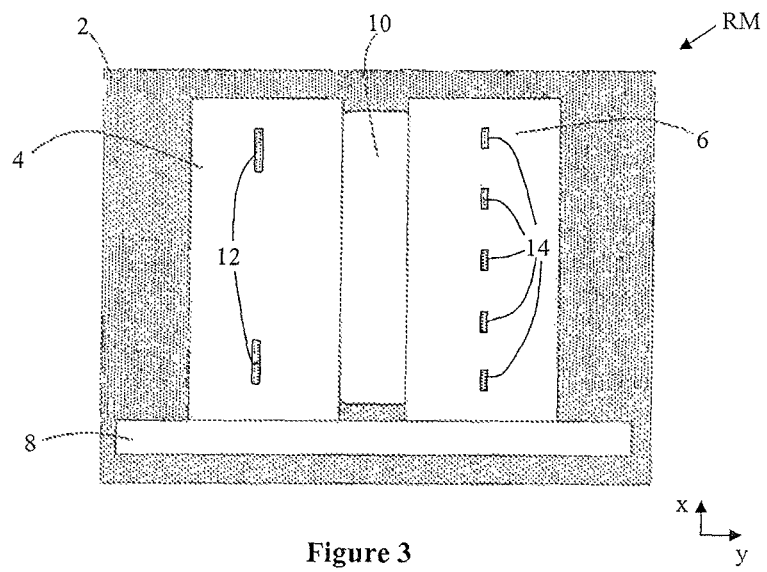
FIG. 3 depicts the patterning device masking apparatus in an alternative configuration.

FIG. 2 shows schematically the patterning device masking apparatus RM viewed from below. The patterning device masking apparatus RM comprises a support structure 2, a first masking blade 4 and a second masking blade 6. The masking blades 4, 6 are connected to an actuator 8, which is configured to move the masking blades in the y-direction. The support structure 2 is provided with an opening 10 through which the radiation beam (not shown) passes during operation of the lithographic apparatus. Edges of the radiation beam in the y-direction may be adjusted using the masking blades 4, 6. This is illustrated in FIG. 3, which shows the edges of the masking blades 4, 6 overlapping with the opening 10 such that they define edges of the radiation beam in the y-direction. The size of the radiation beam in the y-direction may be determined by a field-defining element (not shown) in the illumination system IL. However, edges of the radiation beam in the y-direction may not be sharp, and the masking blades 4, 6 may provide sharpness to these edges. The positions of the edges provided by the masking blades 4, 6 may be adjusted by moving the masking blades 4, 6 in the y-direction.

Figure 4:
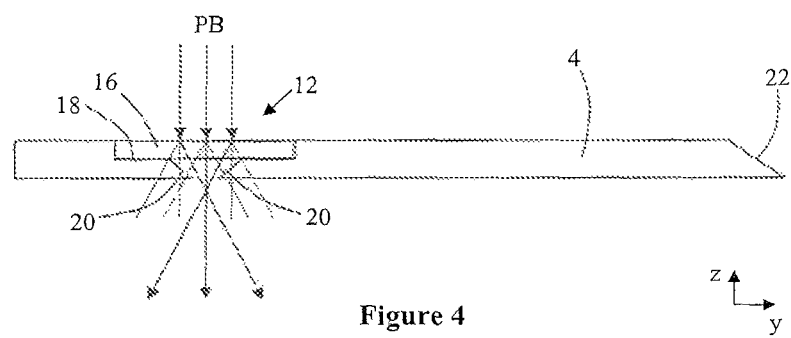
FIG. 4 depicts a first masking blade of the patterning device masking apparatus.

Two holes 12 are provided in the first masking blade 4, and five holes 14 are provided in the second masking blade 6. FIG. 4 shows the first masking blade 4 in cross-section. One of the holes 12 may be seen in FIG. 4. A quartz plate 16 is provided at the holes 12 (e.g., glued into the hole). The quartz plate 16 includes an upper surface that is diffusing (for example having been provided with a rough surface using sand-blasting or some other technique). The quartz plate 16 is held in a recess 18, which extends part-way into the first masking blade 4. The recess 18 is sufficiently deep that the quartz plate 16 does not project from the first masking blade 4. A portion of the hole 12 that is beneath the quartz plate 16 is provided with tapering edges 20. The tapering edges 20 act to provide a sharp edge for radiation that passes through the hole 12, thereby minimising the generation of a penumbra in the projection system PL (see FIG. 1). The first masking blade 4 also includes a tapering edge 22 at its innermost end for the same reason.

Figure 5:
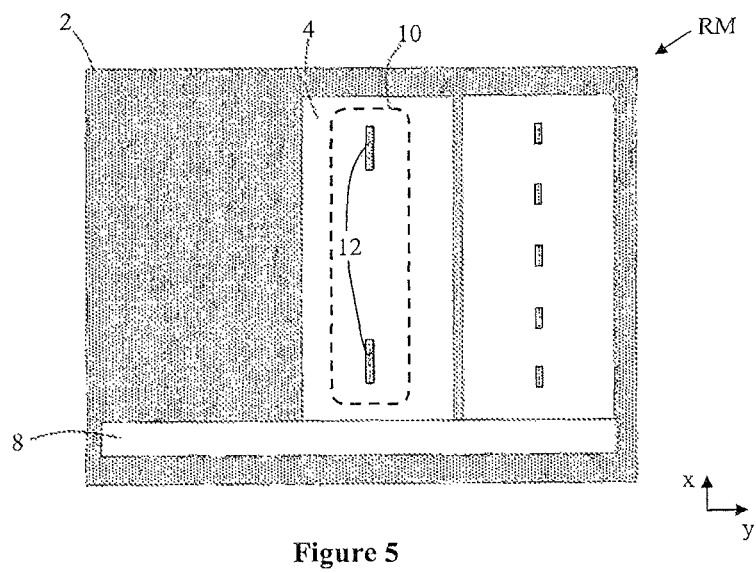
FIG. 5 depicts the patterning device masking apparatus in a further alternative configuration.

In use, during projection of a pattern from a reticle on to a substrate, the masking blades 4, 6 may be positioned as shown in FIG. 3 such that they define edges of the radiation beam in the y-direction. The position of the masking blades is changed however when alignment measurements or measurements of properties of the radiation beam are to be performed. Referring to FIG. 5, when alignment measurements are to be performed, the first masking blade 4 is moved in the y-direction such that it overlaps fully with the opening 10 and such that holes 12 in the first masking blade 4 are located beneath the opening 10. The masking blade 4 thus blocks the majority of the radiation beam, but allows radiation to pass through the holes 12 into the projection system (see FIG. 1). Although the opening 10 is obscured by the first masking blade 4 it is indicated using a dotted line in FIG. 5 in order to allow its position to be identified.

Referring again to FIG. 4, when the radiation beam is PB is incident upon the quartz plate 16 the diffusing surface of the quartz plate causes scattering of the radiation beam. The scattering is shown in FIG. 4 as rays that emanate from the quartz plate 16, three rays being generated by each incident ray of the radiation beam PB. The tapering edges 20 of the hole 12 block some of the scattered radiation (this is indicated by dotted lines). However, a proportion of the scattered radiation passes through the hole 14 and will thus pass into projection system PL of the lithographic apparatus (see FIG. 1), thereby providing diffuse radiation that may be used for alignment measurements.

The first masking blade 4 is provided with two holes 12 which, together with the quartz plates 16, provides two sources of diffuse radiation. The diffuse radiation may be used for example to illuminate alignment marks provided in the reticle MA and facilitate alignment of the reticle alignment marks with alignment marks provided in the substrate table WT. The use of diffuse radiation may provide improved alignment measurements compared with non-diffuse radiation (i.e., if diffusing quartz plates 16 were not provided in the holes 12).

Figure 6:
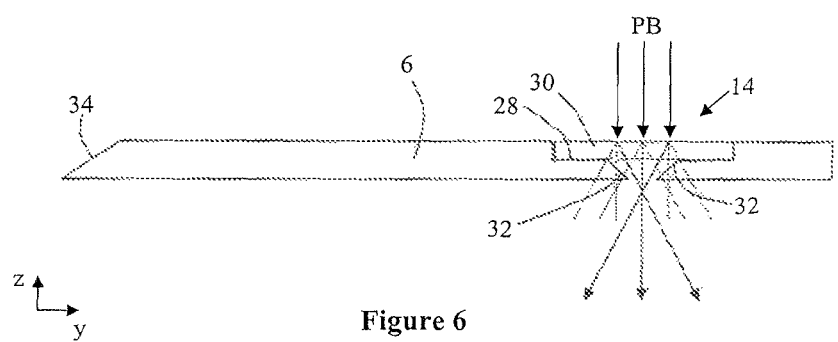
FIG. 6 depicts a second masking blade of the patterning device masking apparatus.

FIG. 6 shows the second masking blade 6 in cross-section. One of the holes 14 is visible in FIG. 6, the hole 14 including a recess 28 that holds a diffusing quartz plate 30. The hole 14 is provided with tapering edges 32 that provide a sharp edge for radiation, which passes through the opening, thereby minimising the generation of a penumbra. The second masking blade also includes a tapering edge 34 at its innermost end for the same reason.

Figure 7:
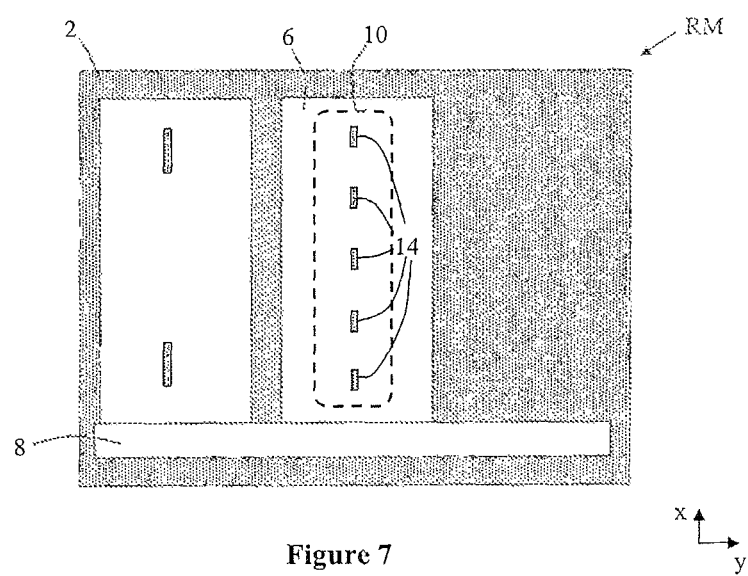
FIG. 7 depicts the patterning device masking apparatus in a further alternative configuration.

As shown in FIG. 7, the second masking blade 6 may be positioned such that it covers the opening 10 and such that only radiation that passes through the holes 14 may enter the projection system PL (see FIG. 1). The five holes 14 in the second masking blade 6 provide five sources of diffuse radiation for the projection system PL. This diffuse radiation allows a sensor BS provided on the substrate table WT to measure properties of the radiation beam such as aberrations present in the radiation beam.

The actuator 8 may be used to move the masking blades 4, 6 in a rapid manner. The actuator 8 may for example rapidly move the masking blades 4, 6 from the configuration shown in FIG. 3 to the configurations shown in FIG. 5 or 7. The actuator 8 thus allows the holes 12, 14 to be rapidly introduced into the radiation beam and then rapidly removed from it. The masking blades 4, 6 may be moved to the configurations shown in FIG. 5 or FIG. 7 within for example less than 1 second, and possibly within less than 100 ms. This allows measurement of properties of the radiation beam or alignment measurements to be performed rapidly, thereby minimising a reduction of throughput of the lithographic apparatus incurred due to the measurements. The measurements may for example be performed each time a new substrate W is introduced beneath the projection system PL (see FIG. 1).

Moving the masking blades 4, 6 to configurations that allow measurements to take place may be achieved more rapidly than at least some prior art arrangements. For example, moving a separate diffuser into the radiation beam (e.g., at some other location in the illumination system) may be slower than moving a masking blade 4, 6 into a measurement configuration. This may be for example because the separate diffuser has a greater mass than a masking blade and/or because the actuator 8 is configured to provide rapid movement. Embodiments of the invention allow for example measurements of properties of the radiation beam to be performed without removing a patterning reticle MA from its operational position (i.e., the position shown in FIG. 1).

In addition to facilitating rapid measurements, embodiments of the invention also provide the advantage that they do not require extra space in the illumination system IL. Masking blades are already conventionally provided in the illumination system in order to allow adjustment of edges of the radiation beam in the y-direction. Embodiments of the invention therefore occupy no additional volume and require no additional actuators. This is advantageous compared with for example an arrangement in which aberration or alignment measurements require a separate diffuser to be introduced into the radiation beam at some other location in the illumination system.

Although the described embodiment of the invention provides two holes 12 in the first masking blade 4 and five holes 14 in the second masking blade 6, any number of holes may be provided in either masking blade. The shape of the holes and/or the number of holes may be determined by a measurement that is to be performed using diffuse radiation provided from the holes. For example, the holes may be positioned such that they provide radiation that is incident upon sensors BA, AS used to perform measurements. The holes 12, 14 may be longer in the x-direction than in the y-direction (e.g., as shown in the Figures). The positions of the masking blades 4, 6 in the y-direction are controllable using the actuator 8 but the positions of the masking blades in the x-direction may be fixed. Making the holes 12, 14 longer in the x-direction than in the y-direction provides a degree of tolerance in the relative positioning of the holes and sensors in the x-direction, thereby making it easier to ensure that sufficient radiation is incident upon the sensors to allow measurements to be performed. Although the holes 12, 14 shown in the Figures are rectangular, they may have any suitable shape. In general, the holes 12, 14 may be longer in a direction in which the masking blades 4, 6 are not moveable than in a direction in which the masking blades are moveable.

The holes 12, 14 may have a length in the y-direction (i.e., the direction in which the masking blades 4, 6 are moveable), which is sufficiently large to illuminate an area at the substrate table that is equal to or longer than the length of a sensor BS, AS in the y-direction. The holes may for example be less than 10 mm long in the y-direction, and may be less than 5 mm long in the y-direction. It may be desirable to provide the holes 12, 14 with dimensions that minimize the area around a sensor BS, AS as is illuminated, in order to minimize the area that is degraded due to exposure to the radiation. For example, a hydrophobic coating may be provided on the sensors BS, AS and around the sensors, and this coating may be degraded over time by exposure to the radiation. Minimising the area around a sensor BS, AS as is illuminated will minimize the area of coating that is degraded due to exposure to radiation. The dimensions of the holes 12, 14 may take into account tolerances in the relative positioning of the holes and sensors.

Because the quartz plates 16, 30 are provided in the holes 12, 14 upstream of the tapered edges 20, 32 (i.e., such that the radiation passes through the quartz plates before it passes the tapered edges), the radiation is made diffuse before sharp edges are provided to the radiation by the tapered edges. If the quartz plates were to be provided downstream of the tapered edges, then on making the radiation diffuse they would also reduce the sharpness of the edges of the radiation. This is not desirable since it could increase the amount of radiation that is incident on substrate table coatings in the vicinity of sensors BS, AS and could lead to damage of those coatings.

The holes 12, 14 may be positioned such that at least one of the masking blades 4, 6 includes sufficient surface area to fully close the opening 10 (i.e., without holes overlapping with the opening).

The holes 12, 14 may be positioned such that they do not overlap with the opening 10 when the masking blades 4, 6 are positioned to allow projection of a pattern from a reticle MA onto a substrate WT (e.g., the configuration shown in FIG. 3).

Although the illustrated quartz plates 16, 30 do not project out of the masking blades 4, 6 this is not essential; the quartz plates may project out of the masking blades (provided that there is space in the illumination system to accommodate this).

Although the holes 12, 14 are provided with tapering edges 20, 32, these are not essential. Inner edges of the holes 12, 14 may for example terminate with a step. This may reduce the sharpness of edges of radiation provided by the holes.

Although a single actuator 8 is used to move the masking blades 4, 6 in the illustrated embodiment, two or more actuators may be used.

Although quartz diffusing plates 16, 30 are shown as having a diffusing upper surface, the quartz diffusing plates 16, 30 may additionally or alternatively have a diffusing lower surface. Although quartz diffusing plates 16, 30 are used as diffusing material that converts the radiation beam PB into diffuse radiation, the diffusing material may be any suitable material. The diffusing material may be sufficiently transmissive to allow measurements to be made using radiation that has passed through the diffusing material. The diffusing material may be provided with a rough surface that provides scattering of radiation, the rough surface for example being formed using an abrasive process such as sand-blasting. The diffusing material may include an internal structure that scatters radiation in order to provide diffuse radiation. The diffusing material may comprise a holographic diffuser.

Although two masking blades 4, 6 are shown in the illustrated embodiment of the invention, any suitable number of masking blades may be provided.

Although the illustrated embodiment of the invention relates to a scanning lithographic apparatus, the invention may be applied to a stepping lithographic apparatus.

Cartesian coordinates are shown in the Figures merely to facilitate explanation of the embodiment of the invention. They are not intended to imply that any features of the invention must have a particular orientation.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims that follow.

The invention claimed is:

1. A lithographic apparatus, comprising:
    an illumination system configured to provide a beam of radiation;
    a support structure configured to support a patterning device, the patterning device serving to impart the radiation beam with a pattern in its cross-section;
    a substrate table configured to hold a substrate;
    a projection system configured to project the patterned radiation beam onto a target portion of the substrate; and
    a patterning device masking blade provided with a hole comprising inner edges and a diffusing material being located in the hole and upstream of the inner edges such that the radiation beam passes through the diffusing material before it is incident upon the inner edges.

2. The lithographic apparatus of claim 1, wherein the diffusing material does not project from the hole.

3. The lithographic apparatus of claim 1, wherein the inner edges comprises tapering edges.

4. The lithographic apparatus of claim 1, wherein the hole is shorter in a direction in which the masking blade is moveable than in a direction in which the masking blade is not moveable.

5. The lithographic apparatus of claim 1, wherein the masking blade has dimensions such that the masking blade closes an opening through which the radiation beam passes into the projection system during operation of the lithographic apparatus.

6. The lithographic apparatus of claim 1, wherein the hole is one of a plurality of holes.

7. The lithographic apparatus of claim 1, further comprising:
    an actuator configured to move the masking blade.

8. The lithographic apparatus of claim 1, wherein the inner edges include steps.

9. The lithographic apparatus of claim 1, wherein the diffusing material has at least one of a diffusing upper surface and a diffusing lower surface.

10. The lithographic apparatus of claim 1, wherein the masking blade comprises a tapering edge.

11. A lithographic apparatus, comprising:
    an illumination system configured to provide a beam of radiation;
    a support structure configured to support a patterning device, the patterning device serving to impart the radiation beam with a pattern in its cross-section;
    a substrate table configured to hold a substrate;
    a projection system configured to project the patterned radiation beam onto a target portion of the substrate; and
    a patterning device masking blade provided with a hole and a diffusing material being located at the hole,
    wherein the hole is positioned in the masking blade such that when the masking blade is in a first position no radiation passes through an opening through which the radiation beam passes into the projection system during operation of the lithographic apparatus and when the masking blade is in a second position radiation passes through the hole and through the opening into the projection system.

12. A lithographic apparatus, comprising:
    an illumination system configured to provide a beam of radiation;
    a support structure configured to support a patterning device, the patterning device serving to impart the radiation beam with a pattern in its cross-section;
    a substrate table configured to hold a substrate;
    a projection system configured to project the patterned radiation beam onto a target portion of the substrate; and
    a patterning device masking blade provided with a hole and a diffusing material being located at the hole,
    wherein the masking blade is one of a pair of masking blades, the masking blades being provided with holes that have at least one of different sizes and a different number of holes.

13. The lithographic apparatus of claim 12, wherein one masking blade is provided with one or more holes configured to provide diffuse radiation for an alignment measurement, and the other masking blade is provided with one or more holes configured to provide diffuse radiation for measurement of a property of the radiation beam.

14. A method comprising:
    moving a patterning device masking blade of a lithographic apparatus from a first position, in which the masking blade applies an edge to a radiation beam used to project a pattern from a patterning means onto a substrate, to a second position, in which the masking blade blocks a majority of the radiation beam but allows a portion of the radiation beam to pass through a hole provided with a diffusing material; and
    measuring the radiation using a sensor located beyond a projection system of the lithographic apparatus.

15. The method of claim 14, further comprising measuring a property of the radiation beam or alignment of the patterning means relative to a substrate table.

16. The method of claim 15, further comprising projecting a pattern from the patterning means onto a substrate.

17. A patterning device masking blade provided with a hole comprising inner edges and a diffusing material being located in the hole and upstream of the inner edges such that a radiation beam passes through the diffusing material before it is incident upon the inner edges.

18. A lithographic apparatus of claim 1, further comprising:
- an illumination system configured to provide a beam of radiation;
- a support structure configured to support a patterning device, the patterning device serving to impart the radiation beam with a pattern in its cross-section;
- a substrate table configured to hold a substrate;
- a projection system configured to project the patterned radiation beam onto a target portion of the substrate;
- a first patterning device masking blade provided with a hole comprising inner edges and a diffusing material being located at the hole and upstream of the inner edges such that the radiation beam passes through the diffusing material before it is incident upon the inner edges; and
- a second patterning device masking blade provided with a second hole and a second diffusing material being located at the second hole.

* * * * *

UNITED STATES PATENT AND TRADEMARK OFFICE
CERTIFICATE OF CORRECTION

| | | |
|---|---|---|
| PATENT NO. | : 9,116,446 B2 | Page 1 of 1 |
| APPLICATION NO. | : 13/243528 | |
| DATED | : August 25, 2015 | |
| INVENTOR(S) | : Voogd et al. | |

It is certified that error appears in the above-identified patent and that said Letters Patent is hereby corrected as shown below:

In The Claims

In column 11, line 11, claim 18, after "apparatus", please delete "of claim 1 further" and insert --,--.

Signed and Sealed this
Fifteenth Day of March, 2016

Michelle K. Lee
*Director of the United States Patent and Trademark Office*